United States Patent [19]
Iio et al.

[11] Patent Number: 5,804,923
[45] Date of Patent: Sep. 8, 1998

[54] PLASMA PROCESSING APPARATUS HAVING A PROTECTED MICROWAVE TRANSMISSION WINDOW

[75] Inventors: Kouichi Iio, Amagasaki; Kyouichi Komachi, Kobe; Katsuo Katayama, Amagasaki; Takeshi Akimoto, Tokyo, all of Japan

[73] Assignee: Sumitomo Metal Industries Limited, Osaka, Japan

[21] Appl. No.: 663,645

[22] Filed: Jun. 14, 1996

[30] Foreign Application Priority Data

Jun. 15, 1995 [JP] Japan .................................. 7-148474

[51] Int. Cl.⁶ .................................................. C23C 16/00
[52] U.S. Cl. ............................ 315/111.21; 118/723 MW; 118/723 MP; 204/298.38
[58] Field of Search ......................... 315/111.21, 111.71, 315/111.01, 111.41, 111.81; 118/723 MW, 723 MP, 723 E; 204/298.38, 298.31; 156/345

[56] References Cited

U.S. PATENT DOCUMENTS

| | | | |
|---|---|---|---|
| 4,992,665 | 2/1991 | Mohl | 250/423 R |
| 5,529,632 | 6/1996 | Katayama et al. | 118/723 MP |
| 5,545,258 | 8/1996 | Katayama et al. | 118/723 MP |

*Primary Examiner*—Robert J. Pascal
*Assistant Examiner*—David H. Vu
*Attorney, Agent, or Firm*—Barnes & Thornburg

[57] ABSTRACT

A plasma processing apparatus includes a microwave introducing member, which is provided with a microwave transmission opening through which microwaves pass into a processing chamber. The microwave introducing member is also provided at a transmission opening with a dielectric member. Preferably, the dielectric member is formed to have a relative dielectric constant of 4 to 10 and an insulation resistance of $10^8$ to $10^{12}\Omega$.

7 Claims, 3 Drawing Sheets

PLASMA PROCESSING APPARATUS HAVING A PROTECTED MICROWAVE TRANSMISSION WINDOW

TECHNICAL FIELD

The present invention relates to a plasma processing apparatus, and more particularly to a microwave-plasma processing apparatus for etching semiconductor wafers, or for forming thin films on the wafers.

BACKGROUND ART

In fabrication of highly integrated semiconductor devices, microwave-plasma processing apparatuses have been widely used. In such a microwave-plasma processing apparatus, reaction gases and microwaves are introduced into a vacuum chamber to generate gas-discharge, so that a plasma is produced in the chamber. The plasma is applied to a substrate to etch the surface thereof, or to form thin film layers thereon. For dry-etching and embedding technology, it has become important to control generation of the plasma and acceleration of ions in the plasma independently, and been studied extensively.

FIG. 1 is a cross-sectional view illustrating a microwave-plasma processing apparatus disclosed in Japanese Patent Laying Open, Kokai Heisei 6-104098 filed by the common applicant to this application. The invention aimed to realize control of generation of a plasma and acceleration of ions in the plasma independently. In FIG. 1, a numeral reference "11" represents a reaction vessel, which is made of metal such as stainless steel, aluminum, or the like. The reaction vessel 11 has a periphery wall of double structure forming a coolant path 12. Along the coolant path 12, coolant circulates from a coolant inlet 12a to a coolant outlet 12b. A reaction chamber 13 is formed in the reaction vessel 11. The reaction vessel 11 is sealed at the top with a microwave introducing window 14, which is made of dielectric material, such as quartz glass, Pyrex glass, alumina, etc., having a low dielectric loss and heat resistance. For heating the interior of the reaction chamber 13, an electric heater, not shown in FIG. 1, is provided around the reaction vessel 11. Both by heating with the electric heater and cooling with the coolant circulating in the coolant path 12, the inside of the reaction chamber 13 is controlled in temperature.

The microwave introducing window 14 is provided on the lower surface with a conductive plate 31 of metal acting as a grounded electrode. The conductive plate 31 is provided with a plurality of microwave transmission openings 32, arranged perpendicularly to the direction of traveling of microwaves. The conductive plate 31 is grounded (33) through the reaction vessel 11. The conductive plate 31 may be placed in the middle between the microwave introducing window 14 and an object holder 15a, while the conductive plate 31 is grounded (33) through the reaction vessel 11, although the arrangement is not shown.

In the reaction chamber 13, the object holder 15a holding an object 30 to be processed is placed on a stage 15, which moves up and down by a driver (not shown). The object holder 15a is connected to a high-frequency power supply 18 to generate bias voltage on the surface of the object 30. The object holder 15a is provided with a chucking mechanism (not shown), such as an electrostatic chuck to hold the object 30 firmly. The object holder 15a is also provided with a cooling mechanism (not shown) in which coolant circulates for cooling the object 30. On the bottom of the reaction vessel 11, a gas outlet 16 connected to an exhaust apparatus (not shown) is formed. On the side wall of the reaction vessel 11, a gas inlet 17 is formed to introduce predetermined reaction gas into the reaction chamber 13.

Over the reaction vessel 11, a dielectric line 21, composed of a metal plate 21a of aluminum, or the like, and a dielectric layer 21c, is provided. The end of the dielectric line 21 is sealed with a reflecting plate 21b of metal. The dielectric layer 21c is attached on the lower surface of the metal plate 21a. The dielectric layer 21c is made of fluorine resin, polyethylene, polystyrene, or the like, having a low dielectric loss. The dielectric line 21 is connected through a waveguide 22 to a microwave oscillator 23, so that microwaves generated by the microwave oscillator 23 travel through the waveguide 22 into the dielectric line 21.

In the above mentioned microwave-plasma processing apparatus, for etching the surface of the object 30 held by the object holder 15a, the position of the stage 15 is adjusted in height so that the object 30 is placed at the appropriate position. Next, unnecessary gases are discharged from the reaction chamber 13 through the gas outlet 16, then the reaction gas is introduced from the gas inlet 17 into the reaction chamber 13 until the pressure thereof reaches a predetermined level. At the same time, the coolant is introduced from the coolant inlet 12a into the coolant path 12, and is discharged from the coolant outlet 12b. Subsequently, microwaves generated by the microwave oscillator 23 travels along the waveguide 22 to the dielectric line 21. When the microwaves are introduced in the dielectric line 21, electromagnetic field is generated under the dielectric line 21, and the microwaves pass through the microwave transmission openings 32 into the reaction chamber 13. In response to the microwaves, plasma is generated in the reaction chamber 13. After that, when high-frequency voltage is applied from the high-frequency power supply 18 to the object holder 15a, bias voltage is generated on the surface of the object 30. With the stable bias voltage, ions in the plasma are irradiated vertically to the surface of the object 30 to be etched, while the energy of the ions is controlled.

In the microwave-plasma processing apparatus, the grounded potential is stable relative to the plasma, because the conductive plate 31 with the microwave transmission openings 32 are attached on the microwave introducing window 14. As a result, the plasma potential becomes stable in the reaction chamber 13, and therefore, the stable bias voltage can be applied to the surface of the object 30 uniformly. Consequently, ion energy in the plasma can be well controlled, and the ions can be irradiated to the surface of the object vertically.

According to the conventional microwave-plasma processing apparatus, however, the lower surface of the microwave introducing window 14 is etched with plasma, when the microwave introducing window 14 is made of quartz glass, or the like and a fluorine system of etching gas is employed. That is because, the lower surface of the microwave introducing window 14 is exposed at the microwave transmission openings 32 to the reaction chamber 13. In addition, the microwave introducing window 14 is so expensive and the replacement is troublesome.

OBJECTS OF THE INVENTION

Accordingly, an object of the invention is to provide a plasma processing apparatus in which a microwave introducing member is not etched even if a fluorine system of etching gas is used.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to an aspect of the invention, an electrode plate is provided at a transmission opening, through which microwaves pass into a processing chamber, with a dielectric member. Preferably, the dielectric member is formed to have a relative dielectric constant of 4 to 10 and an insulation resistance of $10^8$ to $10^{12}\Omega$. For instance, the dielectric member is made of alumina ceramic. The dielectric member preferably has the same thickness as that of the electrode plate. The dielectric member may be fitted to the microwave transmission opening.

In the plasma processing apparatus of the invention, the microwave introducing member is provided at the microwave transmission opening with the dielectric member, so that the microwave introducing window is prevented from being etched, even though erosion type of gas, such as fluorine gas, is used for etching. Microwaves pass through the dielectric member into the processing chamber to generate plasma therein.

DETAILED DISCLOSURE OF THE INVENTION

Figure 1:
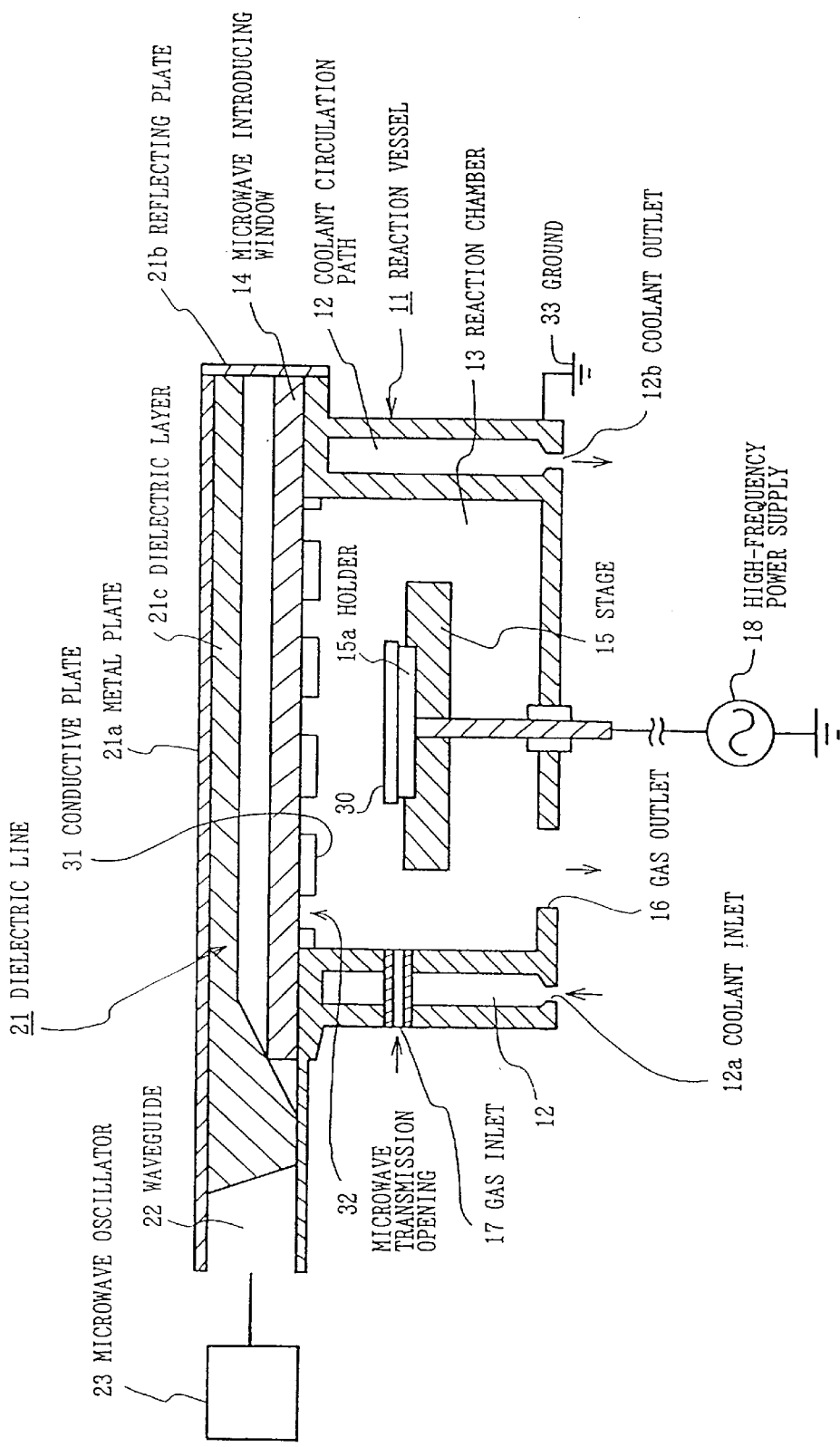
FIG. 1 is a cross-sectional view illustrating a conventional microwave-plasma processing apparatus.
Figure 2:
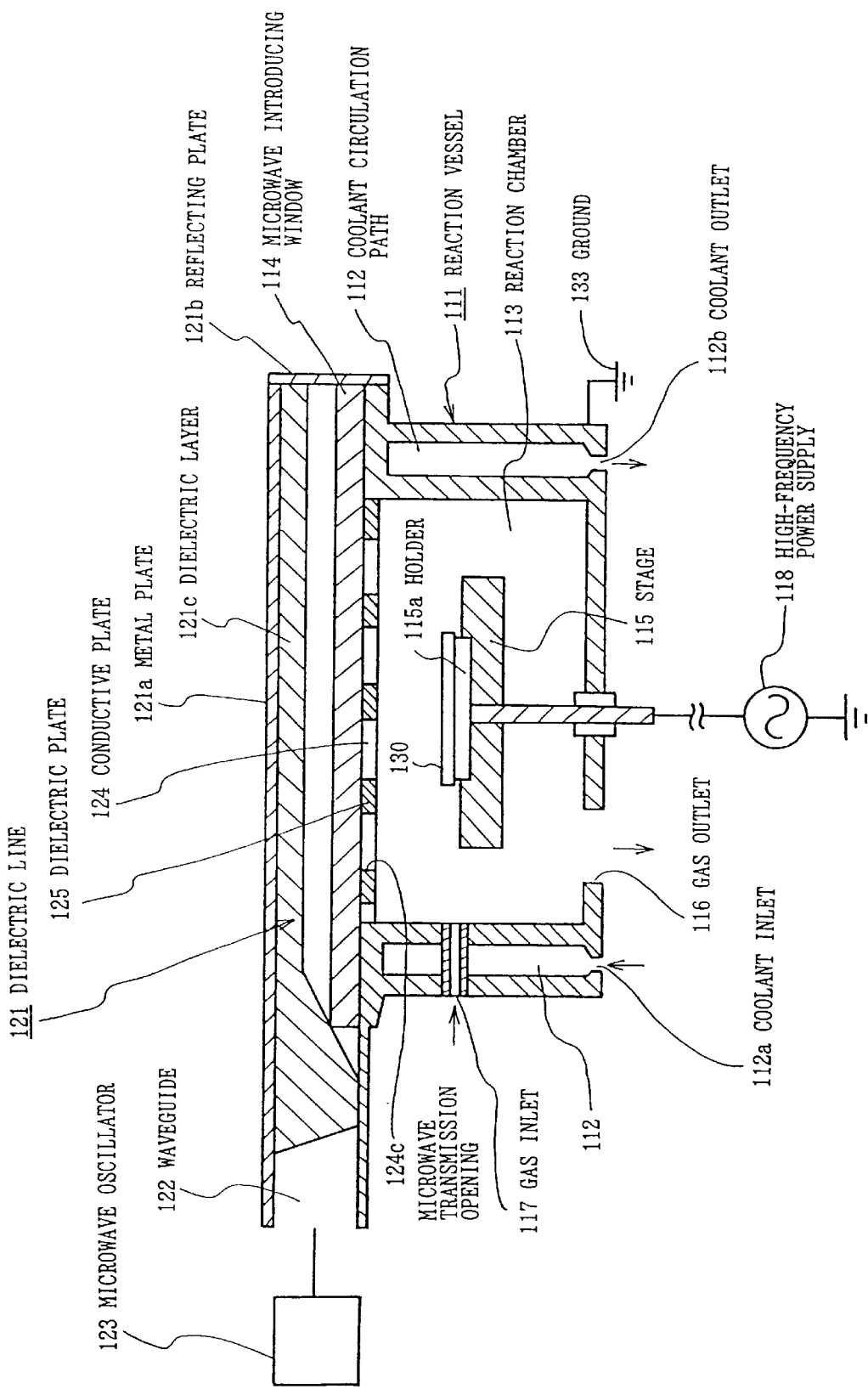
FIG. 2 is a cross-sectional view illustrating a microwave-plasma processing apparatus of a preferred embodiment according to the invention.

Now, a microwave-plasma processing apparatus according to a preferred embodiment is described in conjunction with the appended drawings. FIG. 2 is a cross-sectional view illustrating a microwave-plasma processing apparatus of a preferred embodiment according to the invention. In FIG. 2, a numeral reference "111" represents a reaction vessel, which is made of metal such as stainless steel, aluminum, or the like. The reaction vessel 111 has a periphery wall of double structure forming a coolant path 112. Along the coolant path 112, coolant circulates from a coolant inlet 112a to a coolant outlet 112b. A reaction chamber 113 is formed in the reaction vessel 111. The reaction vessel 111 is sealed at the top with a microwave introducing window 114, which is made of dielectric material, such as quartz glass, Pyrex glass, alumina, etc., having a low dielectric loss and heat resistance. For heating the interior of the reaction chamber 113, an electric heater, not shown in FIG. 2, is provided around the reaction vessel 111.

The microwave introducing window 114 is provided on the lower surface with a conductive plate 124, which functions as a grounded electrode. The conductive plate 124 is provided with a plurality of microwave transmission openings 124c, arranged perpendicularly to the direction of traveling of microwaves. The conductive plate 124 is grounded (133) through the reaction vessel 111.

In the reaction chamber 113, the object holder 115a is placed on a stage 115 to hold an object 130 to be etched. The stage 115 is moved up and down by a driver (not shown). The object holder 115a is connected to a high-frequency power supply 118 to generate bias voltage on the surface of the object 130. The object holder 115a is provided with a chucking mechanism (not shown), such as an electrostatic chuck to hold the object 130 firmly. The object holder 115a is also provided with a cooling mechanism (not shown) in which coolant circulates for cooling the object 130. On the bottom of the reaction vessel 111, a gas outlet 116 is provided to be connected to an exhaust apparatus (not shown). On the side wall of the reaction vessel 111, a gas inlet 117 is formed to introduce predetermined reaction gas into the reaction chamber 113.

Over the reaction vessel 111, a dielectric line 121 is provided. The dielectric line 121 is composed of a metal plate 121a of aluminum, or the like, and a dielectric layer 121c attached on the lower surface of the metal plate 121a. The end of the dielectric line 121 is sealed with a reflecting plate 121b of metal. The dielectric layer 121c is made of fluorine resin, polyethylene, polystyrene, or the like, having a low dielectric loss. The dielectric line 121 is connected through a waveguide 122 to a microwave oscillator 123, so that microwaves generated by the microwave oscillator 123 travel through the waveguide 122 to the dielectric line 121.

In the above mentioned microwave-plasma processing apparatus, for etching the surface of the object 130, the position of the stage 115 is adjusted in height so that the object 130 is placed at the appropriate position. Next, unnecessary gases are discharged from the reaction chamber 113 through the gas outlet 116, then the reaction gas is introduced from the gas inlet 117 into the reaction chamber 113 until the pressure thereof reaches a predetermined level. At the same time, the coolant is introduced from the coolant inlet 112a into the coolant path 112 so that the coolant circulates along the coolant path 112 and is discharged from the coolant outlet 112b. Subsequently, microwaves generated by the microwave oscillator 123 travel along the waveguide 122 to the dielectric line 121. When the microwaves are introduced in the dielectric line 121, electromagnetic field is generated under the dielectric line 121, and the microwaves pass through the microwave transmission openings 124c into the reaction chamber 113. In response to the microwaves, plasma is generated in the reaction chamber 113. After that, when high-frequency voltage is applied from the high-frequency power supply 118 to the object holder 115a, the bias voltage is generated on the surface of the object 130. With the stable bias voltage, ions in the plasma are irradiated vertically to the surface of the object 130, while the energy of the ions is controlled. The object 130 is etched with the plasma in the reaction chamber 113.

Figure 3:
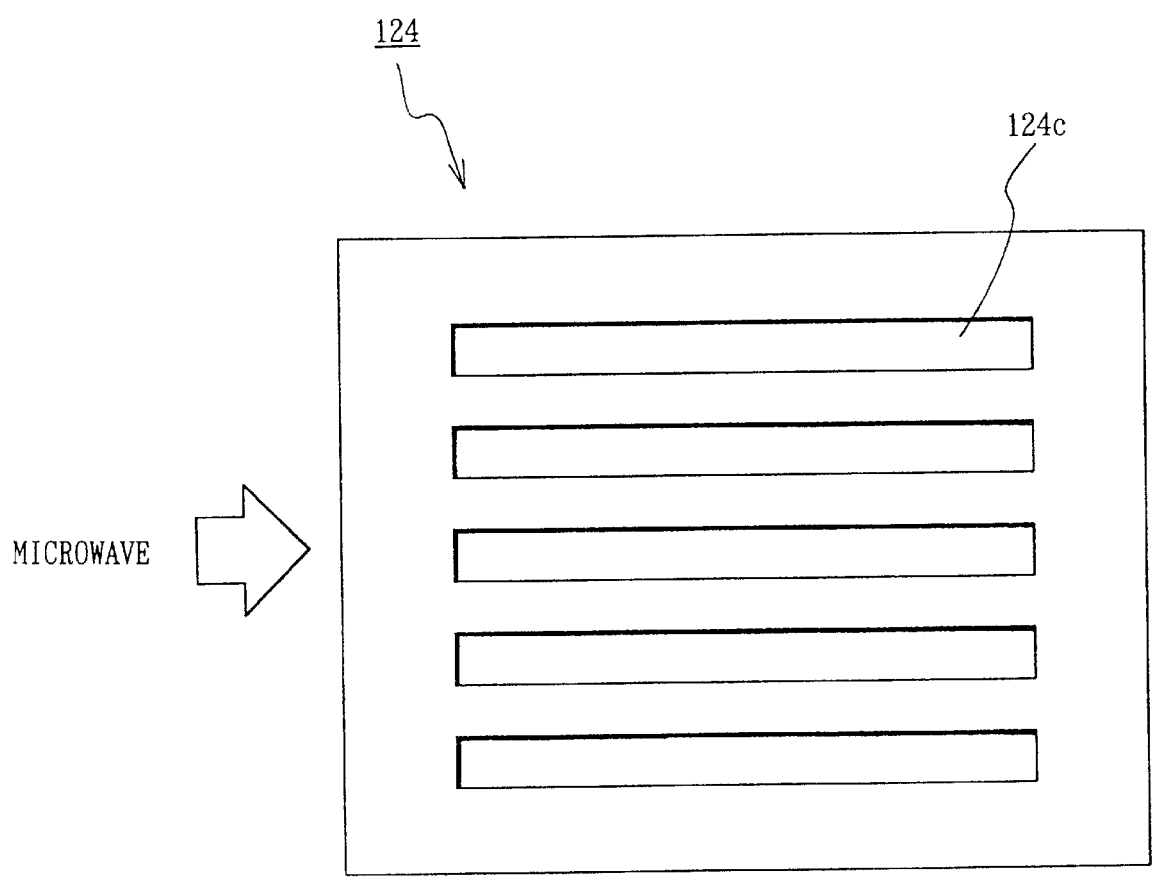
FIG. 3 is a plan view showing a conductive plate (grounded electrode) used in the preferred embodiment shown in FIG. 2.

The conductive plate 124 is made of aluminum. The conductive plate 124 is formed on the lower surface of the microwave introducing window 114 entirely excluding the microwave transmission openings 124c. The conductive plate 124 is placed to be parallel to the object holder 115a. Although the microwave transmission openings 124c are not limited in shape, those are preferably shaped into rectangular as shown in FIG. 3 to allow the microwaves to pass through them easily. In each of the microwave transmission openings 124c, a dielectric plate 125 of alumina ceramic is fitted.

Although the dielectric plate 125 is not limited being made of alumina ceramic, preferably, made of material having a relative dielectric constant "$\epsilon r$" of 4 to 10 and an insulation resistance "IR" of $10^8$ to $10^{12}\Omega$, such as quartz glass, etc. In this embodiment, the dielectric plate 125 is formed to have a thickness of 10 mm, which is equal to that of the conductive plate 124. The thickness of the dielectric plate may be 2 to 4 mm.

In the embodiment, the grounded conductive plate 124 is in contact with the microwave introducing window 114, however, the conductive plate 124 may be placed in the middle between the microwave introducing window 114 and the object holder 115a. That is, the conductive plate 124 can be placed apart from the microwave introducing window 114. In the apparatus, the conductive plate 124 is made of aluminum, however, other conductive material can be used instead, as long as the material does not contaminate easily. For instance, carbon, silicon, and material having oxide layered surface, such as aluminum with alumite surface, are applicable to the conductive plate 124.

TEST OF PERFORMANCE

Next, experimental data for the present invention are described. The test was carried out for the microwave-plasma processing apparatus of the preferred embodiment shown in FIGS. 2 and 3, pursuant to the conditions as follows:

| | |
|---|---|
| Object (130): | 8" Silicon Wafer with 1 μm of SiO$_2$ layer |
| Discharge Gas Mixture: | CF$_4$ of 30 sccm |
| | CHF$_3$ of 30 sccm |
| | Ar of 100 sccm |
| Pressure in Reaction Chamber (113): | 30 mTorr |
| Microwave Frequency: | 2.45 GHz |
| Power for generating Plasma: | 1 kW |
| High-frequency (RF) to Holder 115a, Frequency: | 400 kHz, Power: 600 W |
| Number of Wafers to be tested: | 500 |
| Time for Etching: | 2 minute/wafer |

According to the test, each of the 500 wafers are well etched, and the microwave introducing window 114 is not etched.

For reference, another test using the conventional plasma processing apparatus is performed in the same condition as the above mentioned test except that the microwave introducing window is not provided with the dielectric plate 125. After 200 wafers are etched, the microwave introducing window is etched by 0.5 mm deep.

As understood from the test, according to the preferred embodiment, the microwave introducing member 114 is provided at the microwave transmission openings 124c with the dielectric plate. 125, so that the microwave introducing window 114 is prevented from being etched, even though erosion type of gas, such as fluorine gas containing CF$_4$ and CHF$_3$. Microwaves pass through the dielectric plate 125 into the reaction chamber 113 to generate plasma therein.

Although the invention has been described with respect to the specific embodiments for complete and clear disclosure, the appended claims are not be thus limited but are to be construed as embodying all modification and alternative constructions that may occur to one skilled in the art which fairly fall within the basic teaching herein set forth.

We claim:

1. A plasma processing apparatus having a protected microwave transmission window, the apparatus comprising:

A processing chamber in which an object to be processed is placed;

means for supplying process gas into the processing chamber;

means for generating microwaves to be used for exciting plasma in the processing chamber;

a microwave introducing member, including a microwave transmission window, through which the microwaves pass into the processing chamber;

an electrode plate formed on a surface of the microwave transmission window, the electrode plate provided with an opening through which microwaves pass;

a dielectric member blocking the opening of the electrode plate and a high frequency power supply which applies high frequency voltage to the object.

2. The plasma processing apparatus according to claim 1, wherein, the dielectric member has a relative dielectric constant of 4 to 10 and an insulation resistance of $10^8$ to $10^{12}\Omega$.

3. The plasma processing apparatus according to claim 1, wherein, the dielectric member is made of alumina ceramic.

4. The plasma processing apparatus according to claim 1, wherein, the dielectric member is formed to have the same thickness as that of the electrode plate.

5. The plasma processing apparatus according to claim 1, wherein, the dielectric member is formed to have a thickness of 2 to 4 mm.

6. The plasma processing apparatus according to claim 1, wherein, the dielectric member is fitted to the microwave transmission opening.

7. A plasma etching apparatus having a protected microwave transmission window, the apparatus comprising:

a reaction chamber in which an object to be processed is placed;

means for supplying process gas into the reaction chamber;

means for generating microwaves to be used for exciting plasma in the reaction chamber;

a microwave introducing member, including a microwave transmission window, through which the microwaves pass into the reaction chamber;

an electrode plate formed on a surface of the microwave transmission window, the electrode plate provided with at least one opening through which microwaves pass;

a dielectric member blocking each of the at least one openings of the electrode plate, the dielectric member having a relative dielectric constant of 4 to 10, an insulation resistance of $10^8$ to $10^{12}\Omega$ and the same thickness as that of the electrode plate; and a high frequency power supply which applies high frequency voltage to the object.

* * * * *

UNITED STATES PATENT AND TRADEMARK OFFICE
CERTIFICATE OF CORRECTION

PATENT NO.   : 5,804,923
DATED        : September 8, 1998
INVENTOR(S)  : Kouichi Iio, et. al.

It is certified that error appears in the above-identified patent and that said Letters Patent is hereby corrected as shown below:

Title page, item [73] Assignee:  add –NEC Corporation, Tokyo Japan--

Signed and Sealed this

Twenty-eighth Day of December, 1999

*Attest:*

Q. TODD DICKINSON

*Attesting Officer*        *Acting Commissioner of Patents and Trademarks*

UNITED STATES PATENT AND TRADEMARK OFFICE
CERTIFICATE OF CORRECTION

PATENT NO. : 5,804,923
DATED : September 8, 1998
INVENTOR(S) : Kouichi Iio, et al.

It is certified that error appears in the above-identified patent and that said Letters Patent is hereby corrected as shown below:

Title page,
Item [73] Assignee: add -- NEC Corporation, Tokyo Japan --

Signed and Sealed this

Twenty-eighth Day of August, 2001

Attest:

*Nicholas P. Godici*

NICHOLAS P. GODICI
*Attesting Officer*   *Acting Director of the United States Patent and Trademark Office*